(12) United States Patent
Lee

(10) Patent No.: US 6,537,888 B2
(45) Date of Patent: Mar. 25, 2003

(54) METHOD FOR FABRICATING A SEMICONDUCTOR DEVICE REDUCING JUNCTION LEAKAGE CURRENT AND NARROW WIDTH EFFECT

(75) Inventor: Jae-kyu Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/870,298

(22) Filed: May 30, 2001

(65) Prior Publication Data

US 2002/0011644 A1 Jan. 31, 2002

(30) Foreign Application Priority Data

Jul. 26, 2000 (KR) .......................................... 2000-43009

(51) Int. Cl.⁷ .............................................. H01L 21/76
(52) U.S. Cl. ........................ 438/400; 438/424; 438/433; 438/298
(58) Field of Search ................................ 438/221, 298, 438/296, 424, 433, 445, 447, 400

(56) References Cited

U.S. PATENT DOCUMENTS

| | | | |
|---|---|---|---|
| 4,356,211 A | | 10/1982 | Riseman ...................... 427/85 |
| 4,476,622 A | | 10/1984 | Cogan ......................... 29/571 |
| 5,643,822 A | * | 7/1997 | Furukawa et al. .......... 438/421 |
| 5,770,504 A | * | 6/1998 | Brown et al. ......... 148/DIG. 40 |
| 6,069,057 A | * | 5/2000 | Wu ...................... 148/DIG. 50 |
| 6,177,333 B1 | * | 1/2001 | Rhodes ........................ 438/221 |
| 6,248,645 B1 | * | 6/2001 | Matsuoka et al. ........... 438/199 |
| 6,472,301 B1 | * | 10/2002 | Lin et al. ..................... 438/524 |

* cited by examiner

Primary Examiner—Tuan H. Nguyen
(74) Attorney, Agent, or Firm—Mills & Onello, LLP

(57) ABSTRACT

A semiconductor device for reducing junction leakage current and mitigating the narrow width effect, and a fabrication method thereof, are provided. The semiconductor device includes a semiconductor substrate in which an active region and an isolation region including a trench are formed, a spacer which is formed on both sidewalls of the trench, a channel stop impurity region which is self-aligned by the spacer and locally formed only at the lower portion of the isolation region, an isolation insulating layer in which the trench is buried, and a gate pattern which is formed on the isolation insulating layer and the active region. When the channel stop impurity region is formed only at the lower portion of the isolation region, isolation characteristics between unit cells can be improved, and also, a junction leakage current can be reduced. Further, the present invention can reduce a narrow width effect, in which a threshold voltage rapidly decreases as a channel width becomes narrower, owing to the formation of the channel stop impurity region on the edges of the active region.

14 Claims, 13 Drawing Sheets

METHOD FOR FABRICATING A SEMICONDUCTOR DEVICE REDUCING JUNCTION LEAKAGE CURRENT AND NARROW WIDTH EFFECT

BACKGROUND OF THE INVENTION

1. Field of the Invention

The present invention relates to a semiconductor device and a fabrication method thereof, and more particularly, to a semiconductor device for reducing a junction leakage current or a narrow width effect in which a threshold voltage rapidly drops as the channel width becomes narrow, using a self-aligned local field implantation technique, and a fabrication method thereof.

2. Description of the Related Art

A shallow trench isolation (STI) method is commonly used for isolation between unit cells of a semiconductor device, for example, a dynamic random access memory (DRAM) device. However, in case of the STI method, the width of an isolation region buried by a trench becomes narrower as the integration density of the semiconductor device increases, and as a result, it is not easy to fill the trench with insulating materials.

It has thus been suggested that the trench can be easily buried with insulating materials by forming a shallow trench depth. In the case where the trench is shallowly formed to improve the buried characteristics of the trench, a field transistor operates, such that the isolation characteristics between unit cells are substantially reduced. To solve this problem, after the trench is buried with an insulating material, a large dose quantity ($8E12/cm^2$) of a p-type dopant such as boron (B) is field-ion-implanted on the entire surface of the trench and in an active region at an energy level of 100 keV. Thus, a channel stop impurity region is formed in the lower portion of the isolation region and the active region, so that the threshold voltage of the field transistor is increased and the isolation characteristics between unit cells are improved.

However, in order to increase the isolation between unit cells in the STI method, due to the large dose quantity of dopant for a channel stop implanted at a high energy level, a junction leakage current is increased due to the field profile between junction regions (source/drain regions) and a lower region of the junction region. The junction leakage current is further increased by defects in the junction region, which are caused during implantation of a dopant at a high energy level for forming the channel stop.

In order to address these problems, a number of compensation techniques have been proposed. These include a method for deepening the trench and filling the trench with a different material, a method for reducing a dose quantity during field ion implantation for implanting a dopant on the entire surface of a substrate, and a compensation ion implantation method for implanting a dopant of an opposite type in the junction region so as to compensate for the rise in dopant concentration of the junction region due to the field ion implantation.

However, it is not a straightforward operation to fill the trench by the method for increasing the depth of the trench and filling the trench with a different material, and the junction leakage current is increased by etching damage and stress which are incurred during the formation of a deeper trench. In the method involving the reduction of dose quantity during filed ion implantation, isolation between unit cells is not readily achieved due to the activation of the field transistor. Also, in the case of the compensation ion implantation method, since high-energy ion implantation must be additionally performed in a conventional ion implantation state, the leakage current is increased in the junction region due to defects caused by ion implantation damage.

In addition, a narrow width effect occurs in the STI method. In this effect, the threshold voltage rapidly decreases as with narrowing channel width, owing to the segregation of boron (B) as a p-type dopant due to defects caused at the interface of the trench during subsequent processes.

SUMMARY OF THE INVENTION

To address the above limitations, it is an object of the present invention to provide a semiconductor device having a reduction in junction leakage current and/or a narrow width effect while improving the isolation characteristics between unit cells.

It is another object of the present invention to provide a method for fabricating the semiconductor device.

Accordingly, to achieve the above object, there is provided a semiconductor device. The semiconductor device includes a semiconductor substrate in which an active region and an isolation region including a trench are formed, a spacer formed on both sidewalls of the trench, a channel stop impurity region which is self-aligned by the spacer and locally formed only at the lower portion of the isolation region, an isolation insulating layer in which the trench is buried, and a gate pattern which is formed on the isolation insulating layer and the active region.

The semiconductor substrate is preferably a p-type semiconductor substrate, and the channel stop impurity region is doped with a p-type dopant.

When the channel stop impurity region is formed only at the lower portion of the isolation region, the isolation characteristics between unit cells can be improved, and also, a field caused by a voltage applied to the junction region can be weakened, so that a junction leakage current can be reduced.

The channel stop impurity region is formed at the edges of the active region. When the channel stop impurity region is locally formed at the edges of the active region, a narrow width effect in which a threshold voltage rapidly decreases as channel width becomes narrower, can be reduced.

In order to achieve another object, there is provided a method for fabricating a semiconductor device. According to the method, a mask pattern is formed on a semiconductor substrate. Then, a trench is formed by etching the semiconductor substrate using the mask pattern as an etching mask. As a result, the active region of the semiconductor substrate is defined by the isolation region in which the trench is formed. A trench oxidation layer may be formed on both sidewalls and on the bottom of the trench by oxidizing the entire surface of the trench after forming the trench.

Next, a material layer for a spacer is formed on the entire surface of the semiconductor substrate in which the trench is formed. Subsequently, a channel stop impurity region is locally formed only at the lower portion of the isolation region by self-aligned-field-ion implanting a dopant on the entire surface of the semiconductor substrate using the mask pattern and the material layer for a spacer formed on the sidewalls of the trench, as an ion implantation mask. When the channel stop impurity region is formed only at the lower portion of the isolation region, the isolation characteristics between unit cells can be improved, and also, a field caused by a voltage applied to the junction region can be weakened, so that a junction leakage current can be reduced.

A spacer may be formed on both sidewalls of the trench by anisotropically etching the material layer for a spacer. Here, the spacer and the mask pattern can be used as an ion implantation mask for forming the channel stop impurity region.

Next, an isolation insulating layer is formed in the trench after removing the mask pattern used as an ion implantation mask. Then, a gate pattern is formed on the active region and the isolation insulating layer.

According to another embodiment of the present invention, the edges of the active region can be further exposed by further etching the mask pattern after forming the trench. In this case, the channel stop impurity region is also formed at the edges of the active region. In this way, when the channel stop impurity region is locally formed on the edges of the active region, a narrow width effect in which a threshold voltage rapidly decreases as a channel width becomes narrower, can be reduced.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
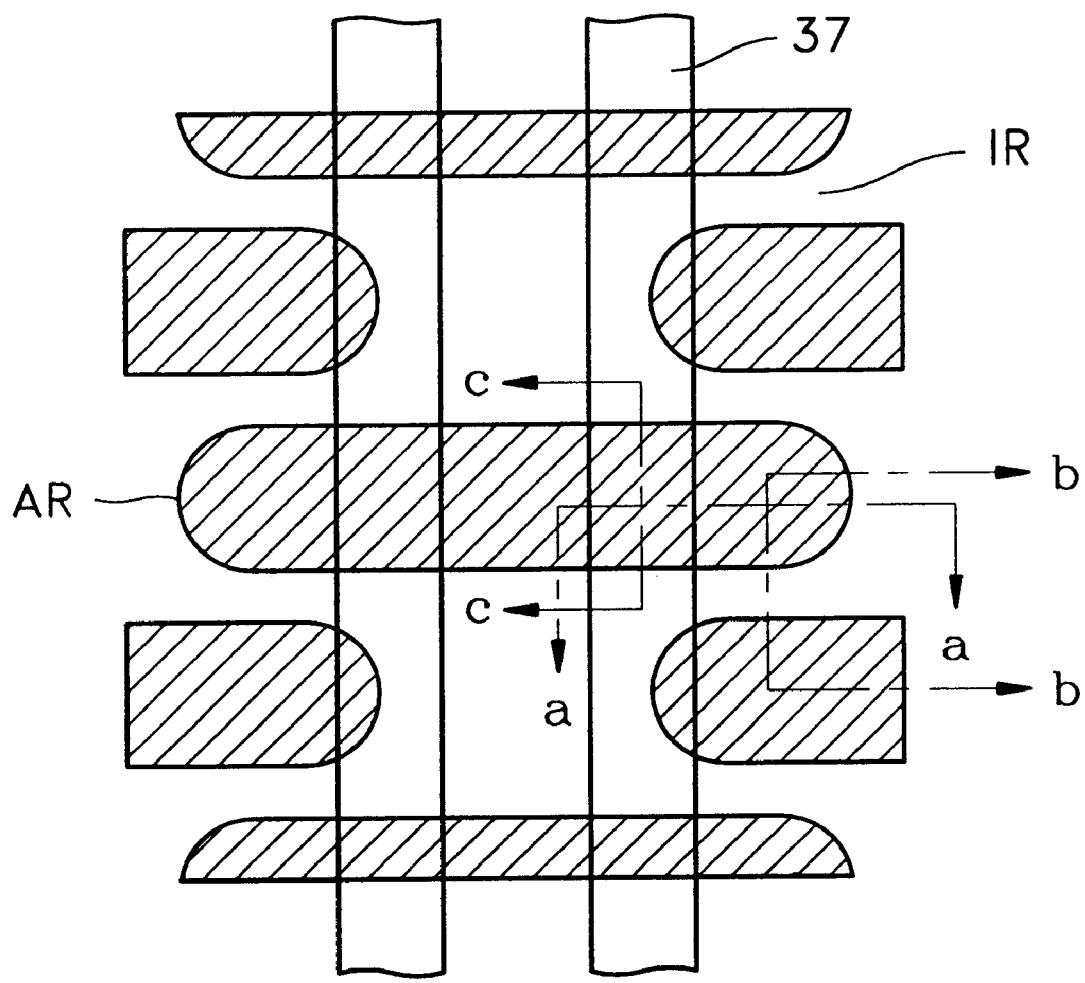
FIG. 1 is a plan view of a semiconductor device according to a first embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

First, a semiconductor device according to a first embodiment of the present invention will be described with reference to FIGS. 1 and 6.

Figure 6:
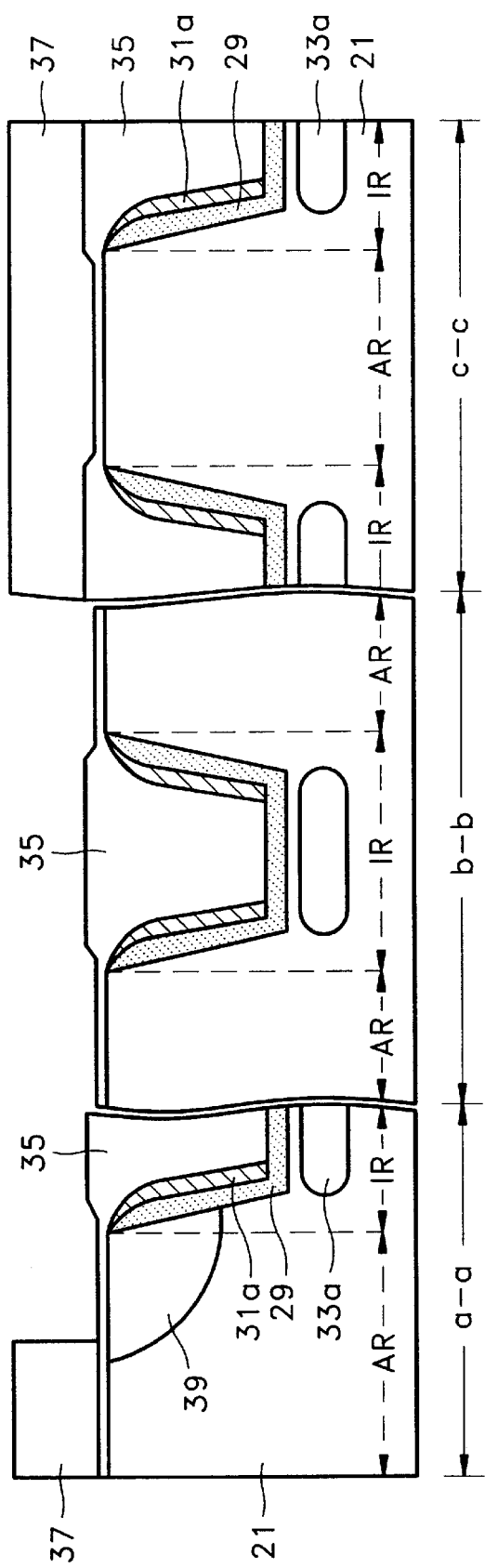

FIG. 1 is a plan view of a semiconductor device according to the first embodiment of the present invention, and FIG. 6 is a sectional view taken along lines a—a, b—b, and c—c of FIG. 1.

Specifically, the semiconductor device according to the first embodiment includes a semiconductor substrate 21 in which an active region AR and an isolation region IR including a trench are formed. In this example, the semiconductor substrate 21 is a p-type substrate. A trench oxidation layer 29 is formed on both sidewalls and on the bottom of the trench, and a spacer 31a is formed on the trench oxidation layer 29. The trench is filled with an isolation insulating layer 35, and a gate pattern 37 is formed on the isolation insulating layer 35 and on the active region AR.

In particular, a channel stop impurity region 33a is self aligned by the spacer 31a and locally formed only at the lower portion of the isolation region IR. The channel stop impurity region 33a is formed using a self-aligned local field ion implantation. The channel stop impurity region 33a is doped with a p-type dopant, for example, boron. The isolation characteristics between unit cells can be improved by the channel stop impurity region 33a formed exclusively at the lower portion of the isolation region IR. In addition, a field caused by a voltage applied to a junction region (a source/drain region) can be weakened so that the junction leakage current can be reduced. This will be explained in detail below. In FIG. 6, reference numeral 39 denotes a source/drain region, and reference numeral 37 denotes a gate pattern.

Next, a semiconductor device according to a second embodiment of the present invention will be described with reference to FIGS. 7 and 11.

Figure 7:
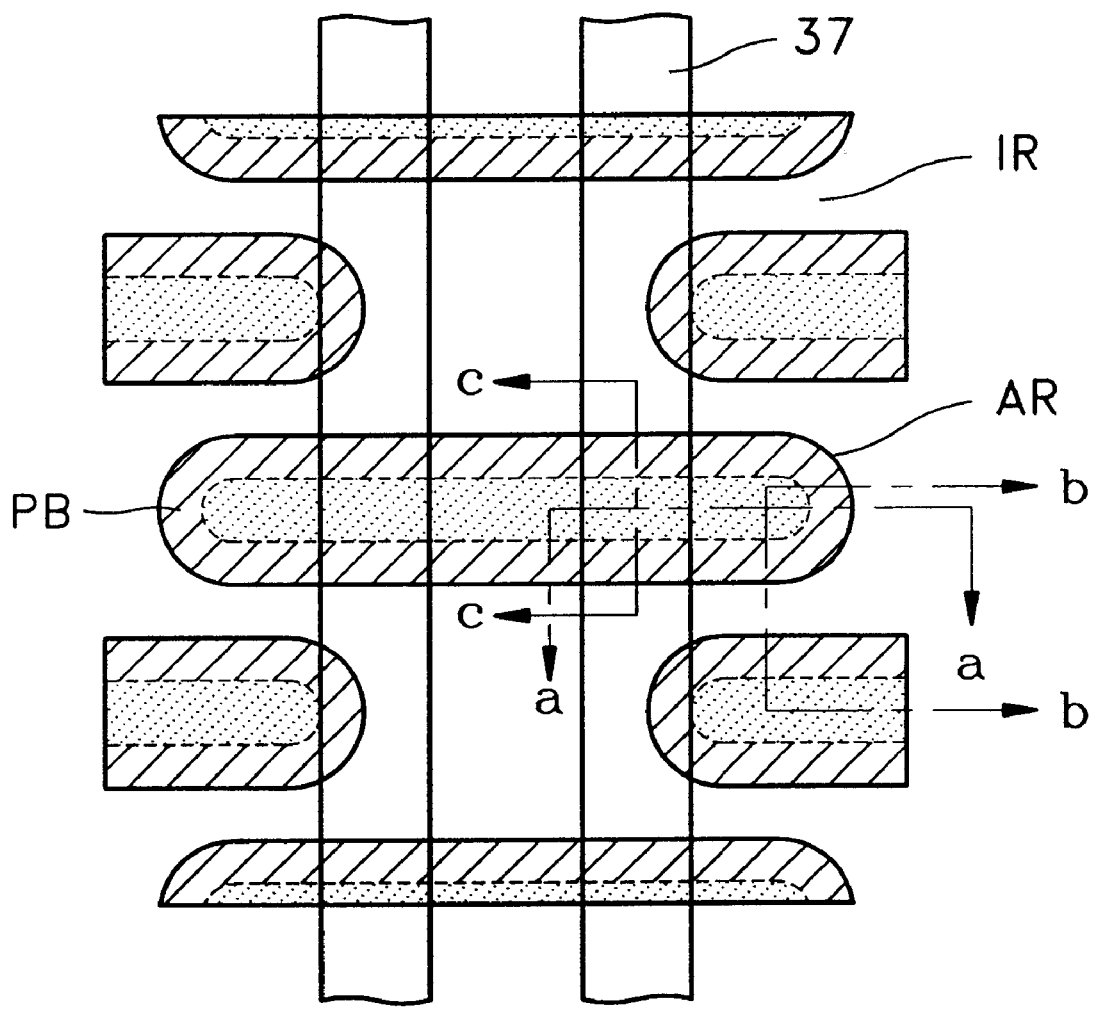
FIG. 7 is a plan view of the semiconductor device according to a second embodiment of the present invention.
Figure 8:
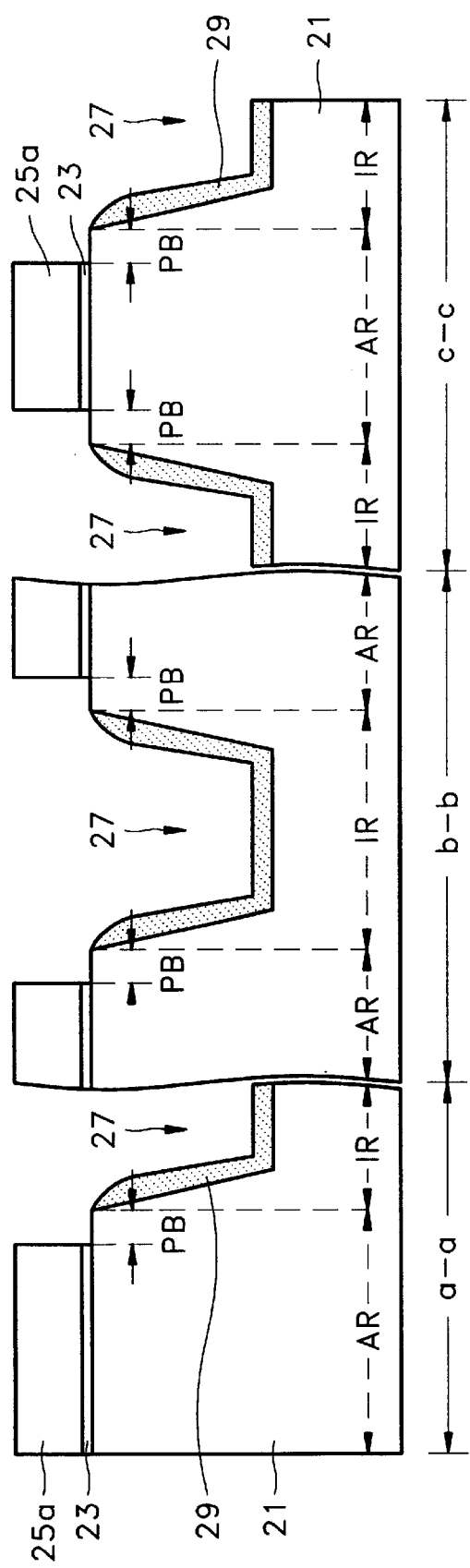
FIGS. 8 through 11 are sectional views illustrating a method for fabricating the semiconductor device according to a second embodiment of the present invention.
Figure 11:
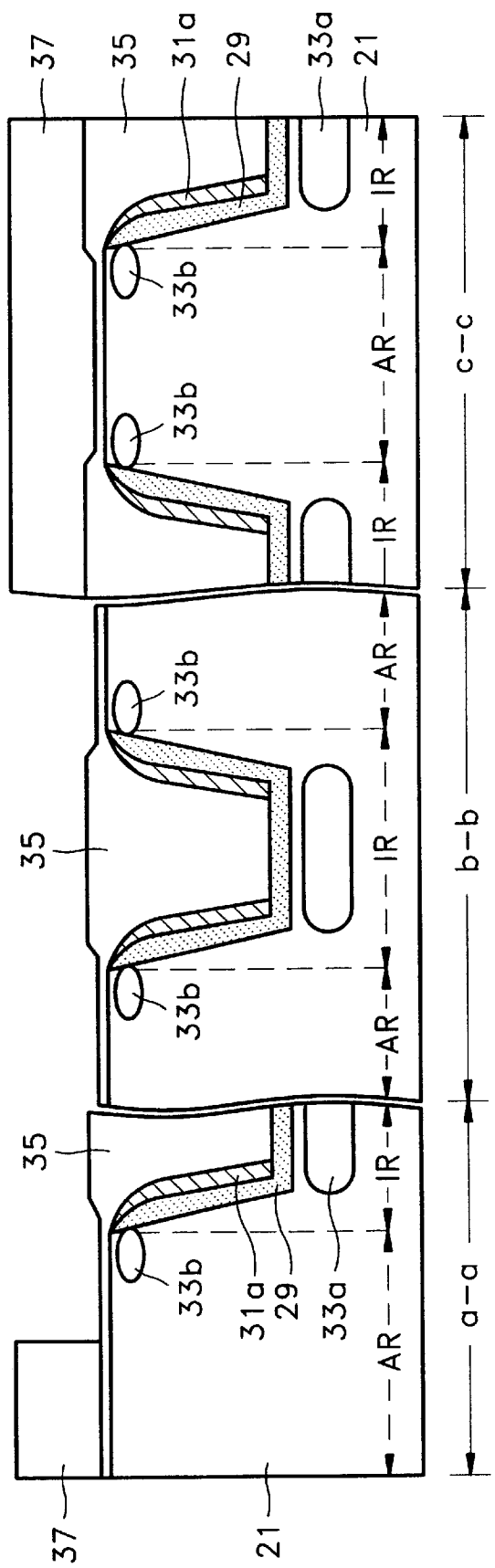

FIG. 7 is a plan view of a semiconductor device according to the second embodiment of the present invention, and FIG. 11 is a sectional view taken along lines a—a, b—b, and c—c of FIG. 7.

Specifically, the semiconductor device according to the second embodiment is the same as that in the first embodiment except that a channel stop impurity region, for example, a p-type dopant region, is formed at the edges (see PB of FIG. 7) of the active region. Thus, in addition to the advantageous effect produced by the first embodiment in which the isolation characteristics between unit cells is improved and junction leakage current is also reduced, the narrow width effect, in which threshold voltage rapidly decreases with narrowing channel width, can be reduced by channel stop impurity regions formed at the edges of the active region.

Hereinafter, a method for fabricating a semiconductor device according to the first and second embodiments of the present invention will be described.

FIGS. 2 through 6 are sectional views illustrating a method for fabricating the semiconductor device according to the first embodiment of the present invention, and more particularly, FIGS. 2 through 6 are sectional views taken along lines a—a, b—b, and c—c of FIG. 1.

Figure 2:
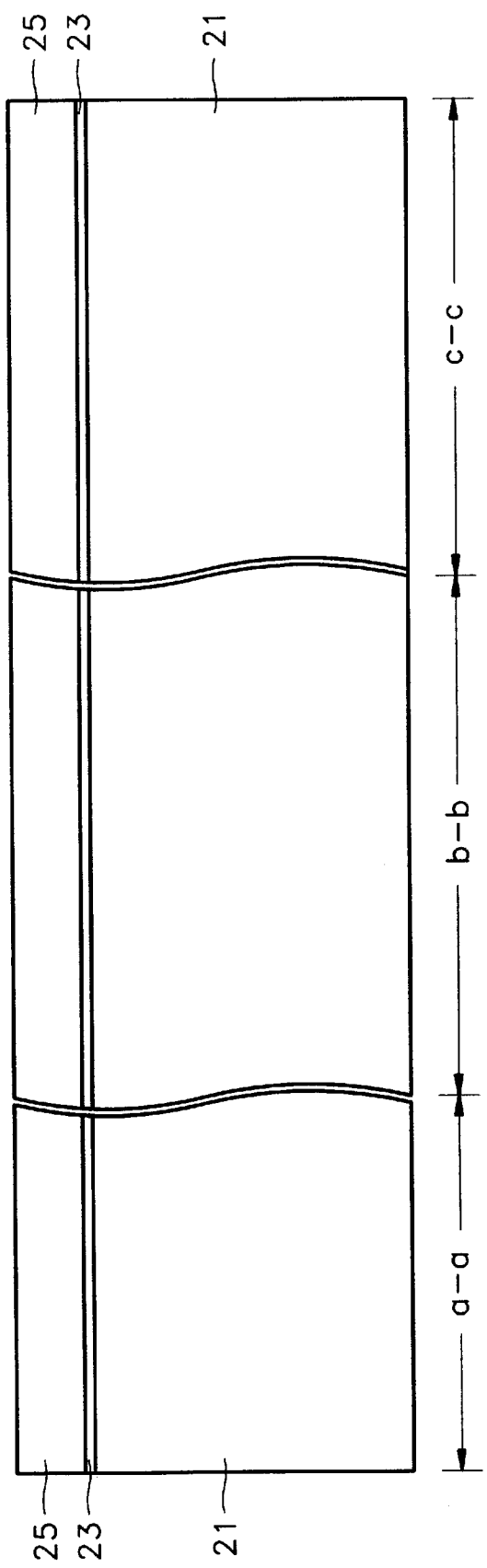
FIGS. 2 through 6 are sectional views illustrating a method for fabricating the semiconductor device according to a first embodiment of the present invention.

Referring to FIG. 2, a pad oxide layer 23 and a mask layer 25 are sequentially formed on a semiconductor substrate 21, for example, a p-type silicon substrate. The mask layer 25 is for example formed of silicon nitride.

Figure 3:
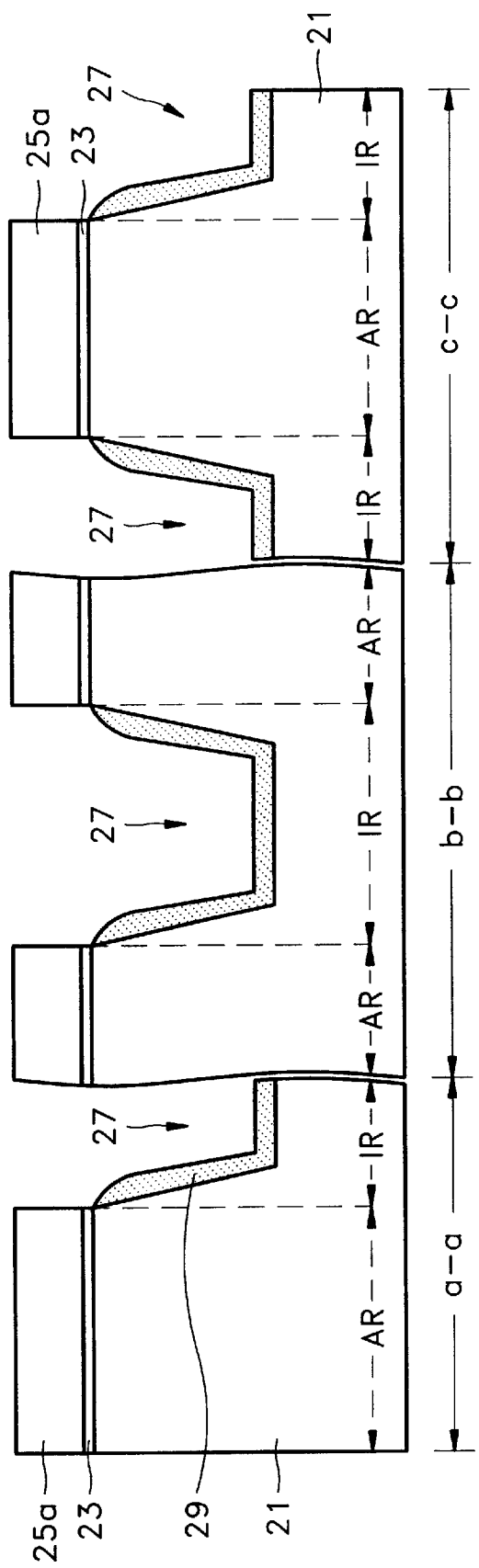

Referring to FIG. 3, a mask pattern 25a is formed by patterning the mask layer 25. A trench 27 is formed by etching the semiconductor substrate 21 using the mask pattern 25a as an etching mask. The depth of the trench 27 is 0.25 μm, for example. An isolation region IR including the trench 27 and an active region AR are formed in the semiconductor substrate 21.

Subsequently, a trench oxidation layer 29 is formed on both sidewalls and on the bottom of the trench 27 by oxidizing the surface of the trench 27. The trench oxidation layer 29 is formed to a thickness of about 50 Å. Oxidizing the surface of the trench 27 increases the refresh time of the semiconductor device by reducing junction leakage current, thereby reducing damage that occurs on the surface of the trench 27 during etching for forming the trench 27. The trench oxidation layer 29 is formed in the present embodiment, but may be omitted as occasion demands, or replaced with another material.

Figure 4:
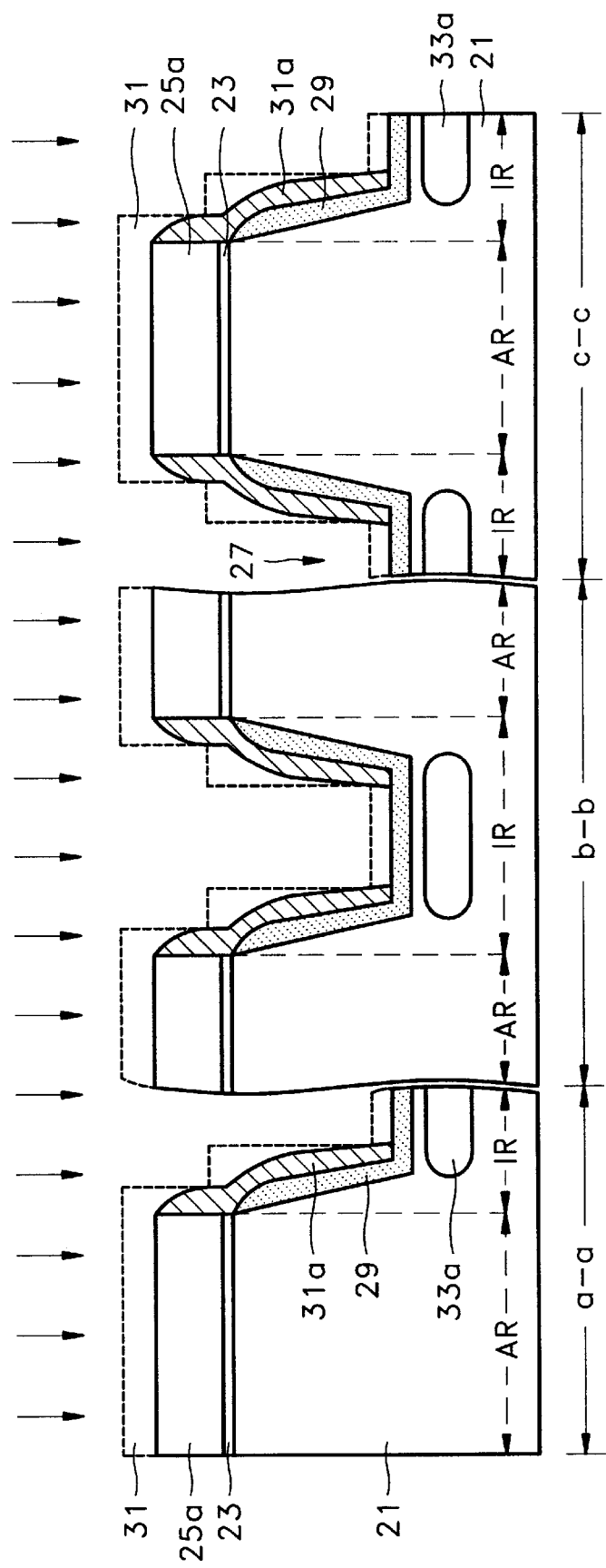

Referring to FIG. 4, a material layer 31 for a spacer, which is indicated with dashed lines, is formed on the surface of the semiconductor substrate 21 in which the trench oxidation layer 29 is formed. The material layer 31 for the spacer is formed of silicon nitride to a thickness of about 100 Å. Next, a spacer 31a is formed on both sidewalls of the trench oxidation layer 29, which is formed on the walls and on the bottom of the trench 27 and on both sidewalls of the mask pattern 25a by anisotropically etching the material layer 31. As occasion demands, in a case where the trench oxidation layer 29 is not formed on the semiconductor substrate 21, the spacer 31a can be formed directly on the walls of the trench 27 and on both sidewalls of the mask pattern 25a.

Since the spacer 31a operates as a buffer for minimizing damage to the surface of the trench during the following field ion implantation, an increase in junction leakage current can be prevented. Further, the spacer 31a prevents sidewall oxidation of the trench 27 during the following oxidation process, for example, during the process of forming a gate oxidation layer. In particular, since the sidewall oxidation applies stress to the walls of the trench 27 owing to volume expansion due to heat oxidation, this stress can be suppressed in the case where the sidewall oxidation is suppressed.

Subsequently, a p-type dopant, for example, boron (B) or $BF_2$ is field-ion implanted in a dose quantity of, for example, $8E12/cm^2$ with a low energy of 15 KeV using the spacer 31a and the mask pattern 25a as an ion implantation mask, on the surface of the semiconductor substrate 21, and consequently, a channel stop impurity region 33a, for example, a p-type dopant region is locally formed exclusively on the bottom of the trench 27. The channel stop impurity region 33a is thus locally formed only on the bottom of the trench 27, that is, only in the isolation region IR by a self-alignment method.

In the prior art approaches described above, the channel stop impurity region is formed on the bottom of the trench and in the lower active region at the same depth by performing field ion implantation after the trench is filled with an insulating material. In contrast, according to the present invention, the channel stop impurity region 33a is formed only on the bottom of the trench 27 by the self-alignment method after forming the trench 27. Thus, the present invention can improve the isolation characteristics between unit cells, and the channel stop impurity region 33a is not formed at the active region, and in particular, is not formed at the lower portion of junction region (a source/drain region), in contrast with the prior art. Thus, an electric field caused by a voltage applied to the junction region during operation of a cell transistor can be advantageously weakened, and junction leakage current can be advantageously reduced.

In the first embodiment, the p-type dopant is field-ion implanted after the spacer 31a is formed; however the p-type dopant can alternatively be field-ion implanted in a state where the insulating layer 31 for the spacer is previously formed. In this case, the insulating layer 31 used for forming a spacer on the sidewalls of the mask pattern 25a and the trench 27, operates as an ion implantation mask.

Figure 5:
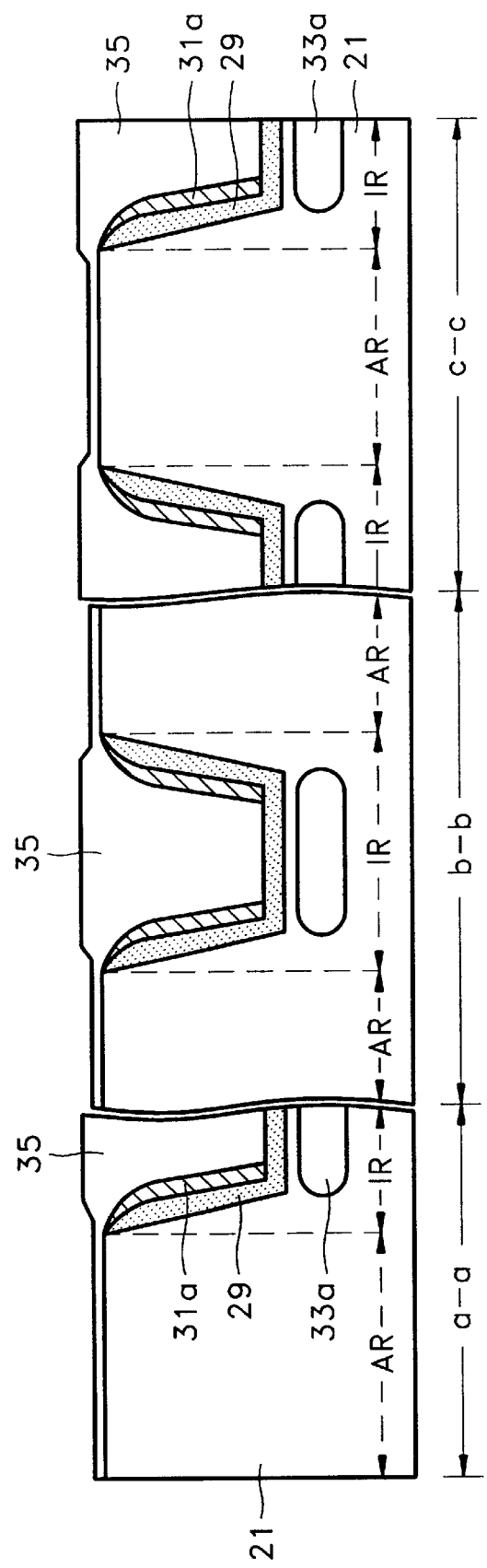

Referring to FIG. 5, the trench 27 is filled by forming an isolation insulating layer 35 on the surface of the semiconductor substrate 21 on which the spacer 31a is formed. Subsequently, planarization is performed by removing the mask pattern 25a and the spacer 31a which is formed on both sidewalls of the mask pattern 25a. The planarization can be performed using an etch back process or a chemical mechanical polishing (CMP) process.

Referring to FIG. 6, a gate pattern 37 is formed on the active region AR and the isolation region IR. The gate pattern 37 is formed of a gate dielectric layer and a gate electrode which is formed on the gate dielectric layer. Subsequently, a source/drain region 39 is formed by implanting an N-type dopant, for example, phosphorus (P) on the surface of the semiconductor substrate 21 on which the gate pattern 37 is formed. The process then continues using a conventional fabrication process.

FIGS. 8 through 11 are sectional views illustrating a method for fabricating a semiconductor device according to the second embodiment of the present invention, and more particularly, FIGS. 8 through 11 are sectional views taken along lines a—a, b—b, and c—c of FIG. 7. The same reference numerals as those in the first embodiment denote the same members.

Specifically, the method for fabricating a semiconductor device according to the second embodiment of the present invention is the same as the first, except for the step of performing field ion implantation by further etching the mask pattern 25a after the mask pattern 25a is formed, and the edges PB of the active region AR are thus exposed.

First, the steps of FIGS. 2 and 3 according to the first embodiment are performed. Next, referring to FIG. 8, the mask pattern 25a is retreated by the region PB by further anisotropically etching the mask pattern 25a. As a result, as shown in FIG. 7, the active region AR around the trench 27, that is, the edge PB of the active region AR, is exposed. Boron (B), a p-type dopant used in the following process, is thus implanted into the edge PB of the exposed active region AR.

Figure 9:
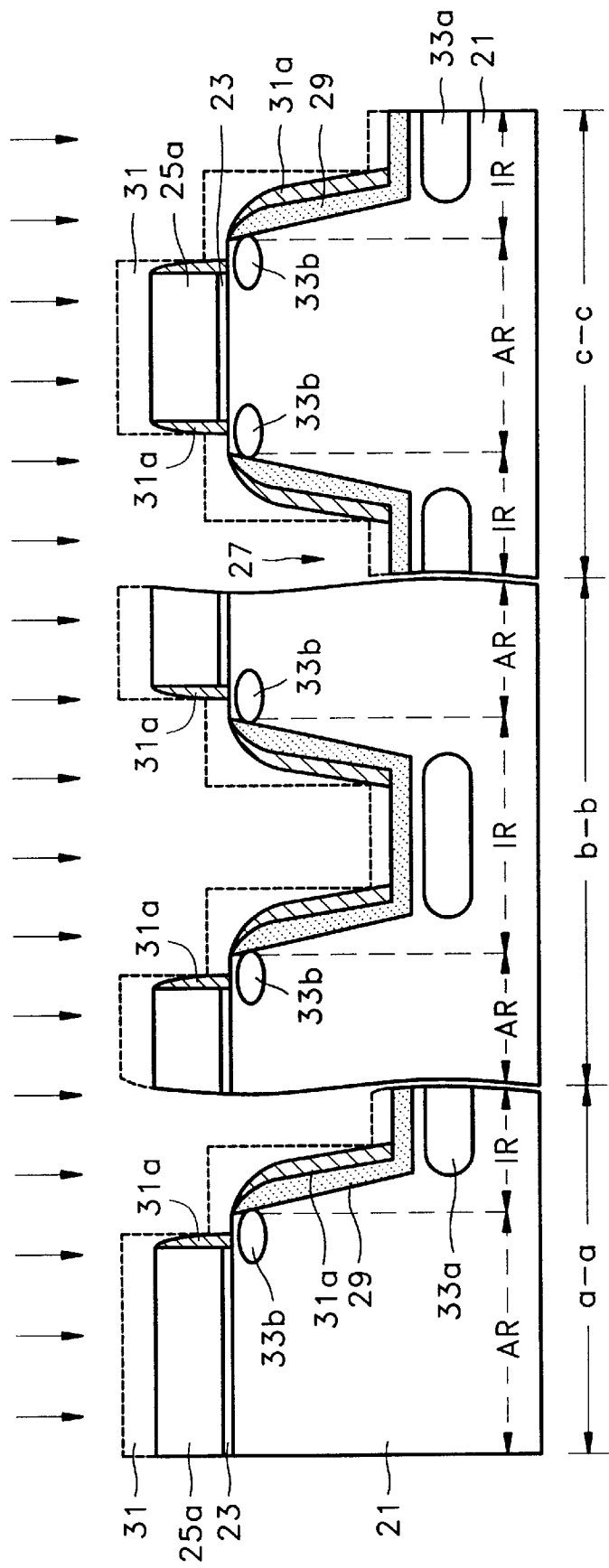

Referring to FIG. 9, a material layer 31 for a spacer, indicated by dashed lines, is formed on the surface of the semiconductor substrate 21 in which the edge PB of the active region AR is exposed. The material layer 31 for the spacer is, for example, formed of silicon nitride. Next, a spacer 31a is formed on a trench oxidation layer 29 which is formed on the walls of the trench 27 and on the sidewalls of the mask pattern 25a by anisotropically etching the material layer 31 for the spacer.

Subsequently, a p-type dopant, for example, boron (B) or $BF_2$, is field-ion implanted in a dose quantity of $8E12/cm^2$ with a low energy of 15 KeV using the spacer 31a and the mask pattern 25a as an ion implantation mask, on the surface of the semiconductor substrate 21, and channel stop impurity regions 33a and 33b, for example, p-type dopant regions are locally formed exclusively at the edges PB of the active region AR and at the lower portion of the isolation region IR. The channel stop impurity regions 33a and 33b are thus locally formed exclusively at the edges PB of the active region AR and at the lower portion of the isolation region IR.

With respect to this, in a shallow trench isolation (STI) method, defects occur at the interface of the trench during the process, and boron (B), a p-type dopant, is segregated at the interface of the trench around the surface of the semiconductor substrate. When Boron (B) is segregated, a narrow width effect, in which a threshold voltage rapidly decreases as a channel width becomes narrower, occurs. However, the semiconductor device according to the second embodiment of the present invention can improve the boron-segregation phenomenon when the channel stop impurity region 33b is formed by implanting a boron dopant into the edges of active region. As a consequence, the semiconductor device according to the second embodiment of the present invention can reduce the narrow width effect owing to a boron-segregation phenomenon in addition to the advantages of the first embodiment.

In the second embodiment, the p-type dopant is field-ion implanted after the spacer 31a is formed, but the p-type dopant can be field-ion implanted in a state where an insulating layer 31 for a spacer is formed. Here, the insulating layer for a spacer 31, which is formed on the sidewalls of the mask pattern 25a and the trench 27, operates as an ion implantation mask.

Figure 10:
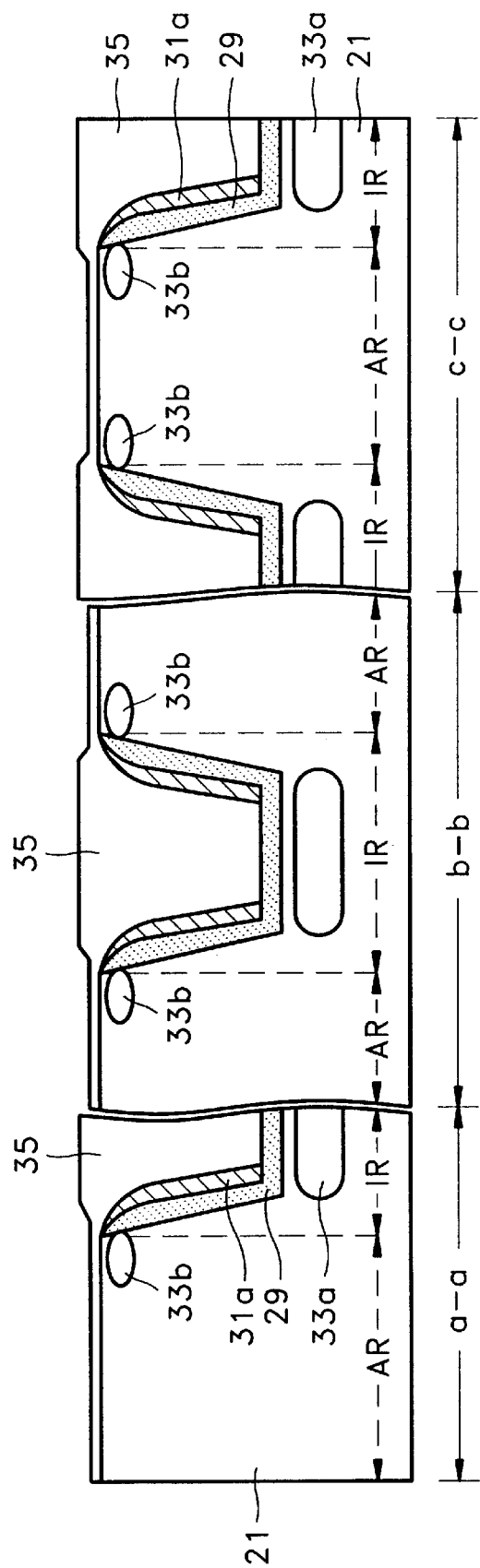

Referring to FIG. 10, the trench 27 is filled by forming an isolation insulating layer 35 on the surface of the semiconductor substrate 21 on which the spacer 31a is formed. Subsequently, planarization is performed by removing the mask pattern 25a and the spacer 31a which is formed on both sidewalls of the mask pattern 25a. The planarization can be performed using an etch back process or a chemical mechanical polishing (CMP) process.

Referring to FIG. 11, a gate pattern 37 is formed on the active region AR and the isolation region IR. The gate pattern 37 is formed of a gate dielectric layer and a gate electrode which is formed on the gate dielectric layer. Subsequently, a source/drain region (39 of FIG. 6) is formed by implanting a N-type dopant, for example, phosphorus (P) on the surface of the semiconductor substrate 21 on which the gate pattern 37 is formed. Following s a conventional fabrication process.

Hereinafter, the characteristics of the semiconductor device according to the present invention and the prior art will be described. In the present invention, a channel stop impurity region is not formed at the lower portion of the junction region (the source/drain region), and the channel stop impurity region is locally formed only at the lower portion of the isolation region. On the contrary, in the prior art, the channel stop impurity region is formed at the lower portion of the junction region (a source/drain region) as well as the isolation region.

Figure 12:
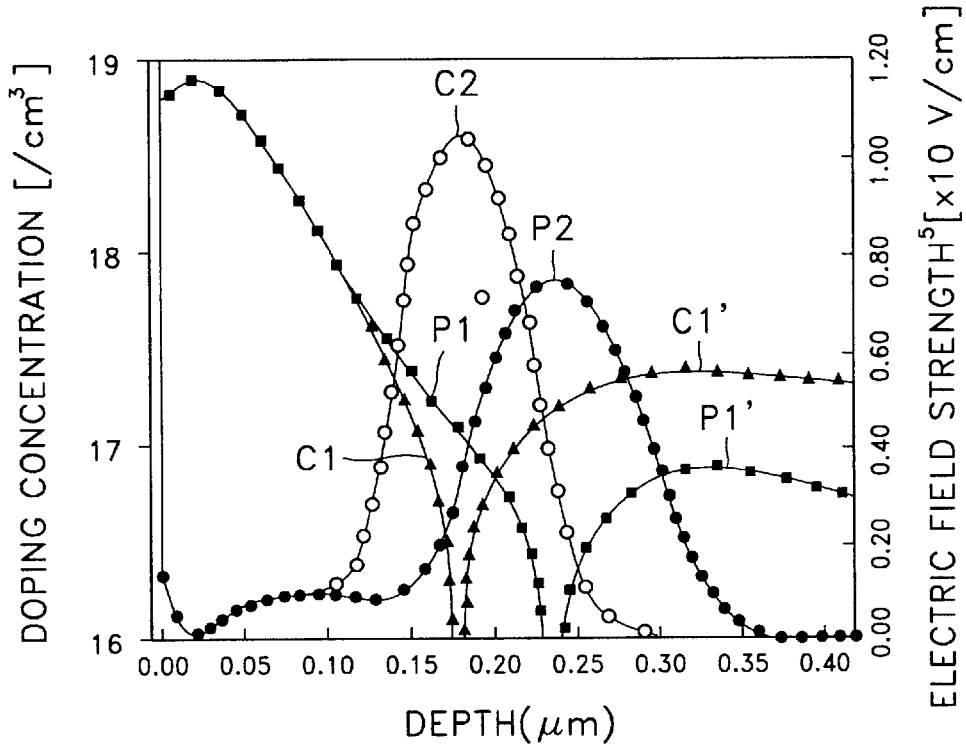
FIG. 12 is a graph illustrating a profile of a dopant doping concentration and electric field strength with respect to the depth from the surface of a junction region of a semiconductor device according the present invention and of a conventional semiconductor device.

Referring to FIG. 12, a dopant doping concentration profile P1 and P1' of the semiconductor device of the present invention is not as steep, as compared to the dopant doping concentration profile C1 and C1' of the prior art. That is, in the semiconductor device according to the prior art, a profile connected from an n-type dopant doping concentration line C1 to a p-type dopant concentration line C1' is quite abrupt, but in the semiconductor device according to the present invention, a profile connected from an n-type dopant doping concentration line P1 to a p-type dopant doping concentration line P1' is more gradual. As a consequence, the maximum electric field strength P2 of the semiconductor device according to the present invention during operation of the semiconductor device is lower than that of the maximum electric field strength C2 according to the prior art.

Figure 13:
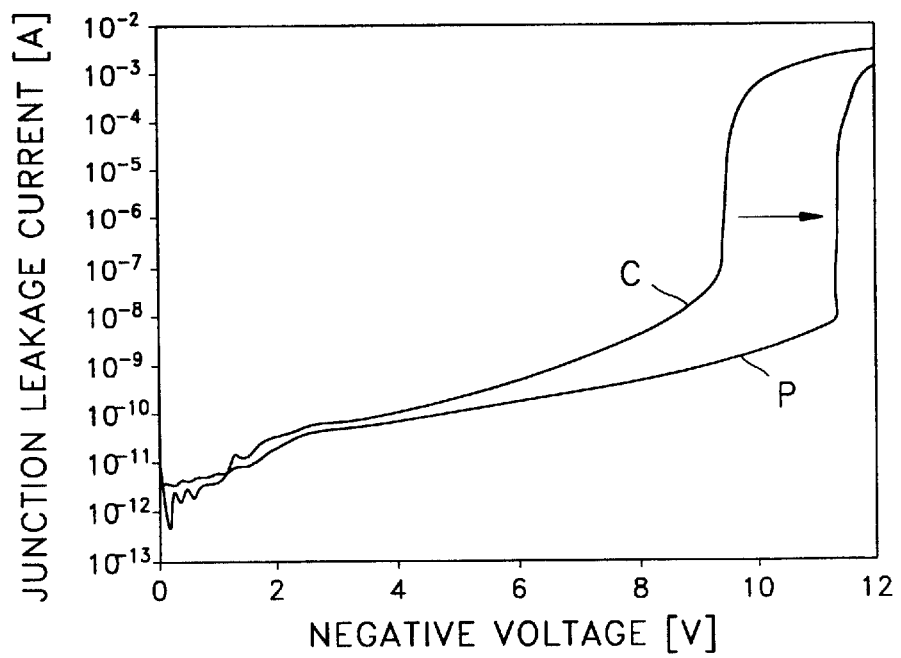
FIG. 13 is a graph illustrating a junction leakage current and a junction breakdown voltage of a semiconductor device according the present invention and of a conventional semiconductor device.

Referring to FIG. 13, a junction leakage current P of the semiconductor device of the present invention is smaller than a junction leakage current C according to the prior art. Thus, a junction breakdown voltage of the semiconductor device of the present invention is improved by an amount indicated by an arrow in FIG. 13, as compared to the junction breakdown voltage according to the prior art.

Figure 14:
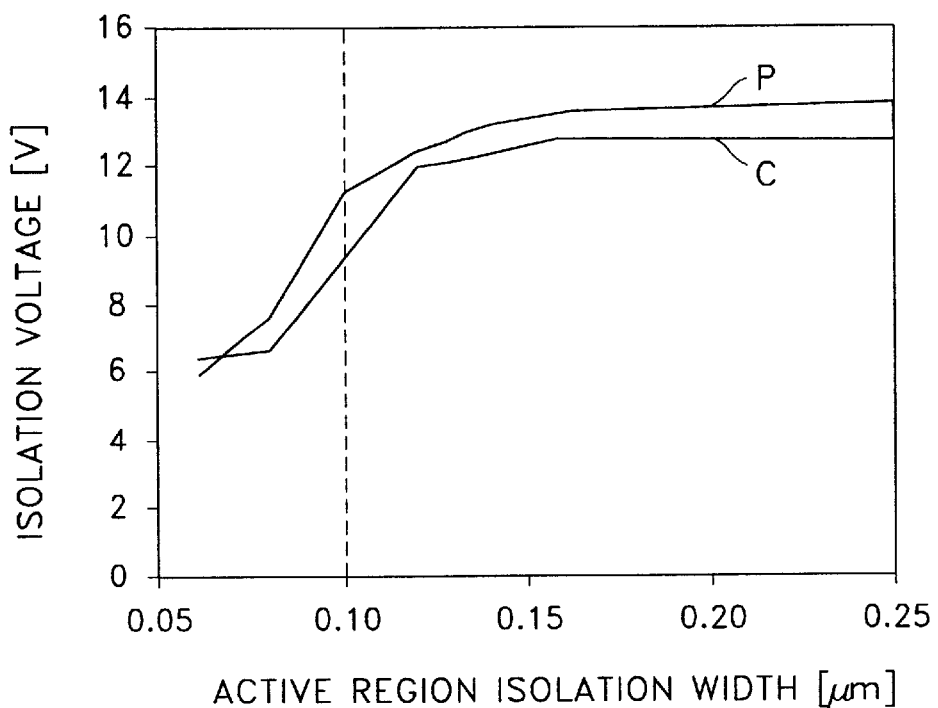
FIG. 14 is a graph illustrating punch through characteristics between cell nodes of the semiconductor device according the present invention and a conventional semiconductor device.

Referring to FIG. 14, an isolation voltage P of the semiconductor device of the present invention is larger than an isolation voltage C of the semiconductor device according to the prior art, for an active region isolation width of, for example, 0.10 $\mu$m. Thus, the punch through characteristics between cell nodes of the semiconductor device of the present invention are higher than those in the prior art.

Figure 15:
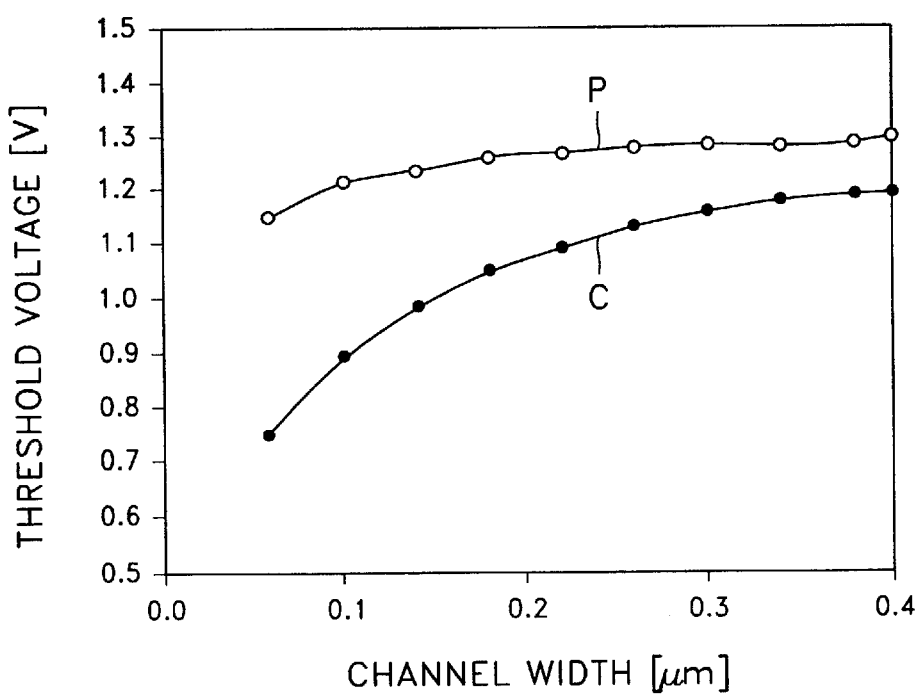
FIG. 15 is a graph illustrating a narrow width effect of a semiconductor device according to the present invention and of a conventional semiconductor device.

Referring to FIG. 15, a slope P in which a threshold voltage decreases as the channel width becomes narrower, of the semiconductor device of the present invention, is smaller than the corresponding slope C in which a threshold voltage decreases as the channel width becomes narrower, of the semiconductor device according to the prior art. Thus, it can be seen that the narrow width effect of the present invention is improved as compared to that of the prior art.

As described above, the present invention can reduce the junction leakage current by weakening an electric field by a voltage applied to the junction region of a cell transistor while a high threshold voltage of a field transistor is maintained for isolation between unit cells, without forming the channel stop impurity region at the lower portion of the junction region and by forming the channel stop impurity region only at the lower portion of the isolation region.

Further, the present invention can reduce the narrow width effect in which the threshold voltage is rapidly dropped as the channel width becomes narrower, because the dopant for a channel stop is locally implanted into the edges of the active region.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for fabricating a semiconductor device, comprising the steps of:
    forming a mask pattern on a semiconductor substrate;
    forming a trench by etching the semiconductor substrate using the mask pattern as an etching mask and defining an isolation region in which the trench is formed and an active region in the semiconductor substrate;
    forming a spacer on sidewalls of the trench;
    locally forming a channel stop impurity region only at the lower portion of the isolation region and on edges of the active region by self-aligned-field-ion-implanting a dopant on the entire surface of the semiconductor substrate using the spacer and the mask pattern as an ion implantation mask;
    removing the mask pattern used as the ion implantation mask;
    forming an isolation insulating layer for burying the trench; and forming a gate pattern on the active region and on the isolation insulating layer.

2. The method according to claim 1, further comprising the step of forming a trench oxidation layer on sidewalls and on a bottom of the trench by oxidizing the surface of the trench after forming the trench.

3. The method according to claim 2, wherein the spacer is formed by a anisotropic etching process, after a material layer for a spacer is formed on the entire surface of the semiconductor substrate on which the trench is formed.

4. The method according to claim 2, wherein the channel stop impurity region is formed on the edges of the active region by exposing the edges of the active region by further etching the mask pattern after the step of forming the trench.

5. The method according to claim 4, wherein the semiconductor substrate is a p-type semiconductor substrate, and the channel stop impurity region is doped with a p-type dopant.

6. The method according to claim 2, wherein the semiconductor substrate is a p-type semiconductor substrate, and the channel stop impurity region is doped with a p-type dopant.

7. A method for fabricating a semiconductor device, comprising the steps of:

forming a mask pattern on a semiconductor substrate;

forming a trench by etching the semiconductor substrate using the mask pattern as an etching mask and defining an isolation region in which the trench is formed and an active region in the semiconductor substrate;

forming a material layer for a spacer on the entire surface of the semiconductor substrate in which the trench is formed;

locally forming a channel stop impurity region only at a lower portion of the isolation region and on edges of the active region by self-aligned-field-ion-implanting a dopant on the entire surface of the semiconductor substrate using the mask pattern and the material layer for a spacer formed on sidewalls of the trench, as an ion implantation mask;

forming an isolation insulating layer for burying the trench;

removing the mask pattern; and forming a gate pattern on the active region and on the isolation insulating layer.

8. The method according to claim 7, further comprising the step of forming a trench oxidation layer on sidewalls and on the bottom of the trench by oxidizing the surface of the trench after forming the trench.

9. The method according to claim 7, further comprising the step of forming a spacer on sidewalls of the trench by etching the material layer for a spacer after forming the material layer for a spacer.

10. The method according to claim 7, wherein the channel stop impurity region is formed on the edges of the active region by exposing the edges of the active region and further etching the mask pattern after the step of forming the trench.

11. The method according to claim 10, wherein the semiconductor substrate is a p-type semiconductor substrate, and the channel stop impurity region is doped with a p-type dopant.

12. The method according to claim 7, wherein the semiconductor substrate is a p-type semiconductor substrate, and the channel stop impurity region is doped with a p-type dopant.

13. A method for fabricating a semiconductor device, comprising the steps of:

forming a mask pattern on a semiconductor substrate;

forming a trench by etching the semiconductor substrate using the mask pattern as an etching mask and defining an isolation region in which the trench is formed and an active region in the semiconductor substrate;

exposing edges of the active region by etching the mask pattern;

forming a trench oxidation layer on sidewalls and on a bottom of the trench by oxidizing the surface of the trench;

forming a spacer on sidewalls of the trench oxidation layer formed on sidewalls of the trench;

locally forming a channel stop impurity region only at the lower portion of the isolation region and on the edges of the active region by self-aligned-field-ion-implanting a dopant on the entire surface of the semiconductor substrate using the spacer and the mask pattern as an ion implantation mask;

forming an isolation insulating layer for burying the trench;

removing the mask pattern; and forming a gate pattern on the active region and on the isolation insulating layer.

14. The method according to claim 13, wherein the semiconductor substrate is a p-type semiconductor substrate, and the channel stop impurity region is doped with a p-type dopant.

* * * * *